United States Patent [19]
Engelsberg et al.

[11] Patent Number: 5,531,857
[45] Date of Patent: Jul. 2, 1996

[54] REMOVAL OF SURFACE CONTAMINANTS BY IRRADIATION FROM A HIGH ENERGY SOURCE

[75] Inventors: Audrey C. Engelsberg, Milton, Vt.; Joseph A. Dehais, Washington, D.C.

[73] Assignee: Cauldron Limited Partnership, Bethesda, Md.

[21] Appl. No.: 309,593

[22] Filed: Sep. 15, 1994

Related U.S. Application Data

[63] Continuation of Ser. No. 865,039, Mar. 31, 1992, abandoned, which is a continuation-in-part of Ser. No. 611,198, Nov. 9, 1990, Pat. No. 5,099,557, which is a division of Ser. No. 216,903, Jul. 8, 1988, Pat. No. 5,024,968.

[51] Int. Cl.$^6$ .................................................. B08B 7/00
[52] U.S. Cl. ................. 156/345; 219/121.68; 219/121.6; 134/1
[58] Field of Search ................. 134/1, 201, 902; 250/492.1, 492.2; 219/121.6, 121.67, 121.68, 121.82, 121.79, 121.78, 121.8; 216/65, 66

[56] References Cited

U.S. PATENT DOCUMENTS

| | | | |
|---|---|---|---|
| 3,364,087 | 1/1968 | Solomon et al. | 156/4 |
| 3,464,534 | 9/1969 | Muncheryan | 197/181 |
| 3,503,804 | 3/1970 | Schneider | 134/1 |
| 4,160,166 | 7/1979 | Etienne et al. | 250/423 |
| 4,181,538 | 1/1980 | Narayan et al. | 148/1.5 |
| 4,292,093 | 9/1981 | Ownby et al. | 148/4 |
| 4,305,973 | 12/1981 | Yaron et al. | 427/35 |
| 4,393,311 | 7/1983 | Feldman et al. | 250/459.1 |
| 4,564,736 | 1/1986 | Jones et al. | 219/121.6 |
| 4,568,632 | 2/1986 | Blum | 250/492.1 |
| 4,668,304 | 5/1987 | Schachameyer et al. | 148/1.5 |
| 4,680,616 | 7/1987 | Delahoy et al. | 357/59 |

(List continued on next page.)

FOREIGN PATENT DOCUMENTS

| | | | |
|---|---|---|---|
| 0297506 | 1/1981 | European Pat. Off. | 134/1 |
| 91646 | 10/1983 | European Pat. Off. | |
| 0233755 | 8/1986 | European Pat. Off. | |
| 268301 | 5/1988 | European Pat. Off. | 250/429.1 |
| 3904969 | 9/1989 | Germany | 134/1 |
| 55-15620 | 2/1980 | Japan | |
| 56-7439 | 1/1981 | Japan | |
| 56-23748 | 3/1981 | Japan | |
| 57-76846 | 5/1982 | Japan | |
| 57-102229 | 6/1982 | Japan | |
| 57-187936 | 11/1982 | Japan | |
| 59-215728 | 12/1984 | Japan | |

(List continued on next page.)

OTHER PUBLICATIONS

Shen, Y., "Laser Manipulation of Particles," *The Principles of Nonlinear Optics*, Chapter 20, 1984, pp. 367–378.

Bollinger, L. D. et al., "Plasma Process Integration For Large Wafer Manufacturing," presented at the Advanced Semiconductor Manufacturing Conference, Cambridge, MA, Nov. 14, 1994.

Lovoi, Paul, "Laser paint stripping offers control and flexibility," *Laser Focus World*, Nov. 1994, pp. 75–80.

Lu, Y–F et al., "Excimer–Laser Removal of $SiO_2$ Patterns from GaAs Substrates," *Jpn. J. Appl. Phys.*, vol. 33 (1994), Part 2, No. 3A, 1 Mar. 1994, pp. L324–L327.

(List continued on next page.)

*Primary Examiner*—Thi Dang
*Attorney, Agent, or Firm*—Howrey & Simon; C. Scott Talbot; W. Jackson Matney, Jr.

[57] ABSTRACT

An apparatus for removing surface contaminants from a planar or irregularly shaped surface of a substrate by high-energy irradiation is provided. The invention enables removal of surface contaminants without altering the underlying molecular crystal structure of the substrate. The source of high-energy irradiation includes a pulsed or continuous wave laser or high-energy lamp.

18 Claims, 15 Drawing Sheets

U.S. PATENT DOCUMENTS

| | | | |
|---|---|---|---|
| 4,687,539 | 8/1987 | Burns et al. | 156/626 |
| 4,731,516 | 3/1988 | Noguchi et al. | 219/121 |
| 4,782,029 | 11/1988 | Takemura et al. | 437/11 |
| 4,920,994 | 5/1990 | Nachbar | 134/1 |
| 4,979,180 | 12/1990 | Muncheryan | 372/92 |
| 4,987,286 | 1/1991 | Allen | 219/121.68 |
| 5,024,968 | 6/1991 | Engelsberg | 134/1 |
| 5,099,557 | 3/1992 | Engelsberg | 29/25.01 |
| 5,151,134 | 9/1992 | Boquillon et al. | 134/1 |
| 5,151,135 | 9/1993 | Magee et al. | 134/1 |
| 5,228,206 | 7/1993 | Grant et al. | 34/1 |

FOREIGN PATENT DOCUMENTS

| | | | |
|---|---|---|---|
| 60-37736 | 2/1985 | Japan . | |
| 60-129136 | 7/1985 | Japan . | |
| 60-129136 | 10/1985 | Japan . | |
| 61-147988 | 7/1986 | Japan | 250/492.1 |
| 62-85433 | 4/1987 | Japan | 250/492.1 |
| 63-178845 | 7/1988 | Japan . | |
| 4-157088 | 5/1992 | Japan . | |
| 83/01400 | 4/1983 | WIPO . | |

OTHER PUBLICATIONS

Lu, Y–F et al., "Laser Cleaning–A New Surface Cleaning Method Without Pollutions," *Mat. Res. Soc. Symp. Proc.*, vol. 344 (1994), pp. 329–334 (presented at the Materials Research Society Spring Symposium, San Francisco, CA, Apr. 5–7, 1994.

Lu, Y–F et al., "Laser–Induced Dry Cleaning in Air—A New Surface Cleaning Technology in Lieu of Carbon Fluorochloride (CFC) Solvents," *Jpn. J. Appl. Phys.*, vol. 33 (1994), Part 2, No. 3B, 15 Mar. 1994, pp. L430–L433.

Lu, Y–F et al., "Laser–Induced Removal of Fingerprints from Glass and Quartz Surfaces," *Jpn. J. Appl. Phys.*, vol. 33 (1994), Part 1, No. 8, Aug. 1994, pp. 4691–4696.

Shulyakovsky, A. Ye. et al., "Silicon Substrate Cleaning Processes in the Manufacture of Semiconductor Devices" (based on Soviet and foreign publications from 1970 to 1983), *Ministry of the Electronics Industry of the USSR–Surveys in Electronics*, Series 2. Semiconductor Devices–No. 2 (1016), Central Electronics Research Institute (M. A. Vernikov, ed.) (1984).

Zehner et al., "Preparation of Atomically Clean Silicon Surfaces by Pulsed Laser Irradiation," *Appl. Phys. Lett.*, 36(1), (Jan. 1, 1980), 56–59.

McKinley et al., "Atomically Clean Semiconductor Surfaces Prepared by Laser Irradiation," *J. Phys. D: Appl. Phys.*, 13, (1980), L193–7.

Burmudez, "Changes in the Surface Composition of Si, $TiO_2$, and $SiO_2$ Induced by Pulsed Ruby–Laser Irradiation," *J. Vac. Sci. Technol.*, 20(1), (Jan. 1982), 51–57.

Jellison et al., "Time–Resolved Ellipsometry," *Applied Optics*, vol. 24, No. 17, (Sep. 1, 1985), 2948–2955.

Bedair et al., "Atomically Clean Surfaces by Pulsed Laser Bombardment," *Jnl. of Appl. Physics*, vol. 40, No. 12, (Nov. 1969), 4776–4781.

Lazzarini, "Lasers for the Cleaning of Statuary: Initial Results and Potentialities", *J. Vac. Sci. Tech.*, vol. 10, No. 6, (Nov.–Dec. 1973), 1039–1043.

Zehner et al., "Surface Studies of Laser Annealed Semiconductors," *Laser–Solid Interactions and Transient Thermal Processing of Materials*, Narayan, Brown and Lemons, eds., Elsevier Science Publishing Co., Inc., (1983), 317–328.

Zehner et al., "Silicon Surface Structure and Surface Impurities After Pulsed Laser Annealing," *Laser and Electron Beam Processing of Materials*, C. W. White and P. S. Peercy, eds., Academic Press, Inc., (1980), 201–207.

Dulcey et al., "Deep UV Photochemistry of Chemisorbed Monolayers: Patterned Coplanar Molecular Assemblies," *Science*, vol. 252, (Apr. 26, 1991), 551–554.

May, "Expanding Laser Applications Foster Technological Evolution," *Photonics Spectra*, (Nov. 1991), 96–104, 106.

Ross, "Dust Busters: Lasers Wipe Submicron Motes From Silicon Wafers," *Scientific American*, (Jun. 1990), 86, 88.

Zapka et al., "Efficient Pulsed Laser Removal of 0.2 μm Sized Particles From a Solid Surface," *Applied Phys. Lett.*, 58(20), (May 20, 1991), 2217–2219.

Lewis "Lasers: A Cure For Dentaphobia?" *Photonics Spectra*, (Apr. 1992), 74–75.

Pettit, "Lasers Take Up Residence in the Surgical Suite," *IEEE Circuits and Devices*, (May 1992), 17–25.

"Laster–assisted micron scale particle removal", K. Imen, S. J. Lee and S. D. Allen, *Appl. Phys. Lett.* 58(2), 14 Jan. 1991.

"Laser Particle Buster", Betty Newbos, *86/Semiconductor International*, Sep., 1992.

"Dust Busters–Lasers wipe submicron motes from silicon wafers", *Scientific American*, Jun., 1990.

"Efficient pulsed laser removal of 0.2 μm sized particles from a solid surface", W. Zapka and W. Ziemlich, *Appl. Phys. Lett.* 58(20), 20 May, 1991.

"Laser cleaning techniques for removal of surface particulates", Andrew C. Tam, *J. Appl. Phys.* 71 (7), 1 Apr. 1992.

"UV/ozone cleaning of surfaces", John R. Vig, *J. Vac. Sci. Technol.* A3 (3), May/Jun. 1985.

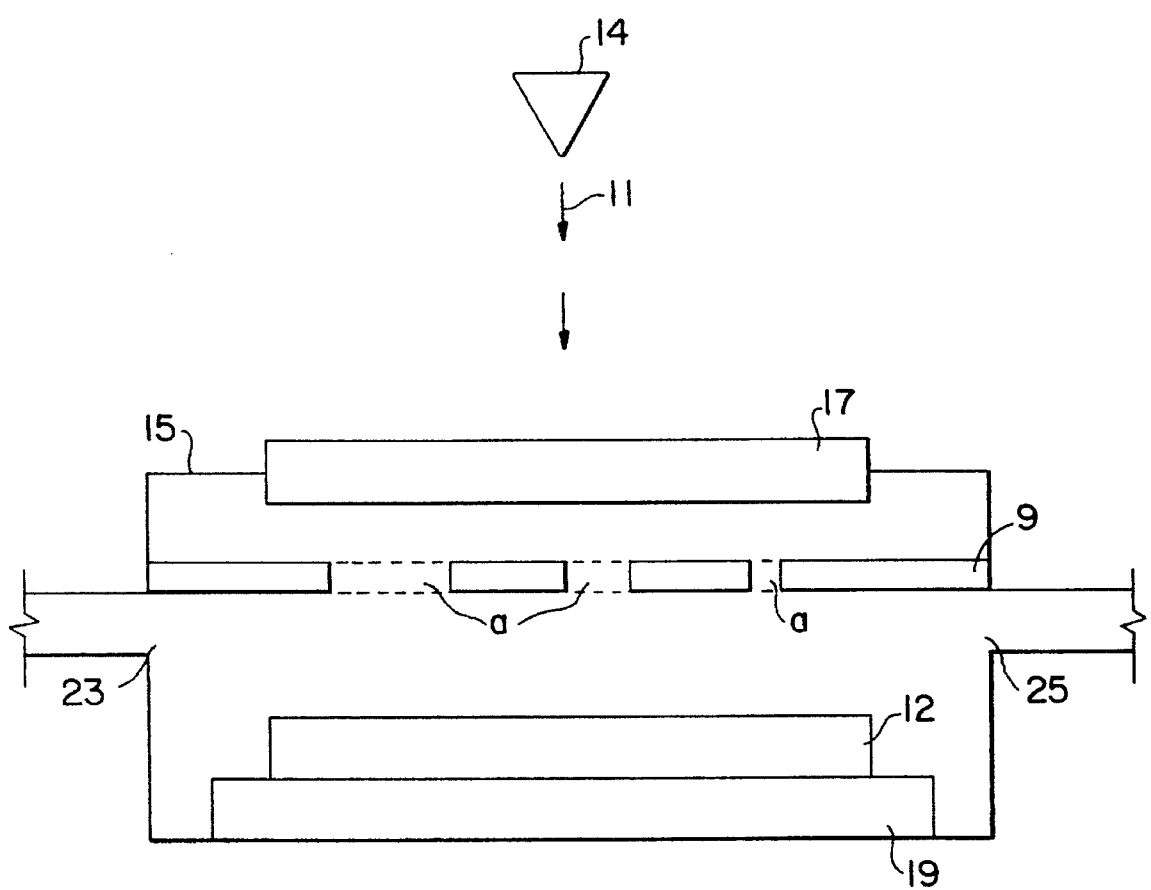

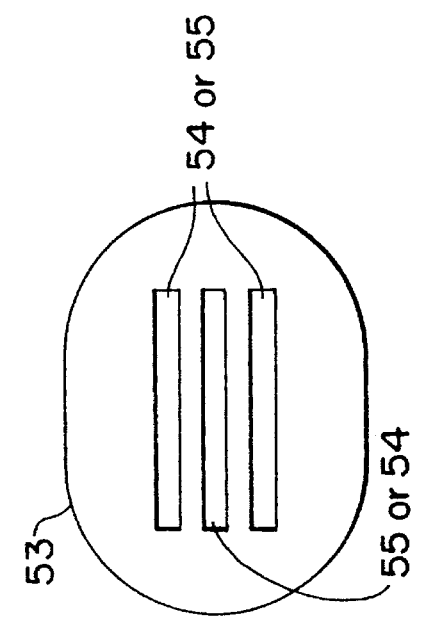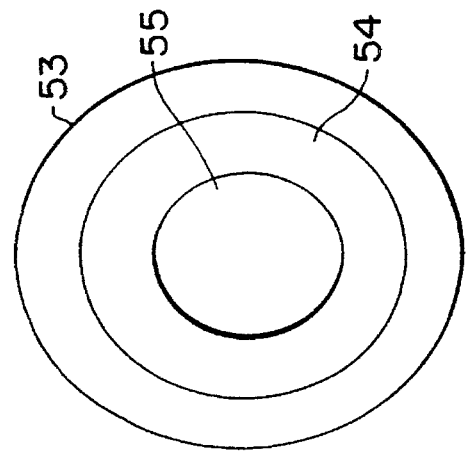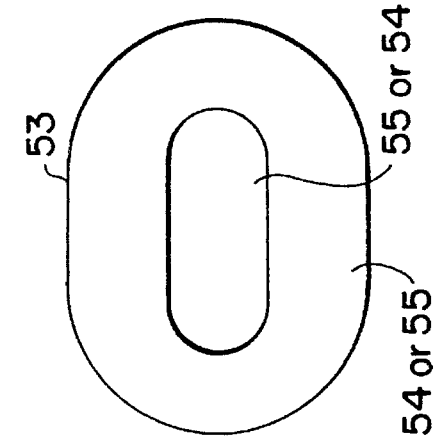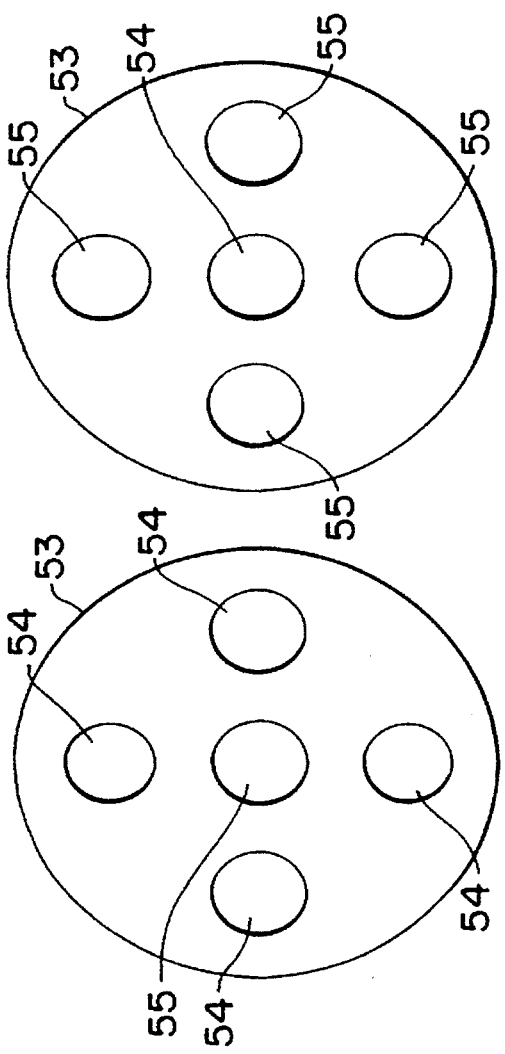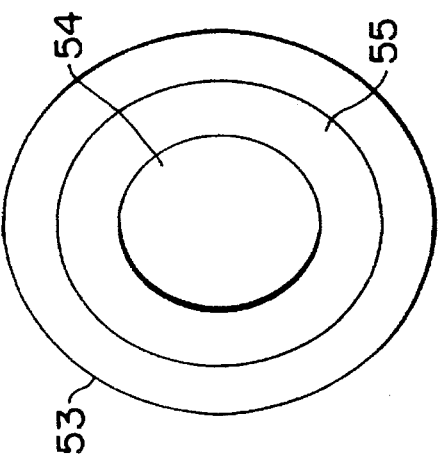

REMOVAL OF SURFACE CONTAMINANTS BY IRRADIATION FROM A HIGH ENERGY SOURCE

This application is a continuation of U.S. patent application Ser. No. 07/865,039, filed on Mar. 31, 1992, now abandoned, which is a continuation-in-part of U.S. patent application Ser. No. 07/611,198, filed Nov. 9, 1990, now U.S. Pat. No. 5,099,557 which is a Divisional of U.S. patent application Ser. No. 07/216,903, filed Jul. 8, 1983, now U.S. Pat. No. 5,024,968.

BACKGROUND OF THE INVENTION

This invention relates to removing contaminants from a surface. More particularly, the invention relates to the removal of contaminants from a substrate surface by irradiation that does not alter the molecular crystal structure of the treatment surfaces.

Surface contaminants include discrete pieces of matter that range in size from submicrons to granules visible to the unaided eye. Such contaminants may be fine dust or dirt particles or unwanted molecules comprised of elements such as carbon or oxygen. Contaminants frequently become adhered to a surface by weak covalent bonds, electrostatic forces, van der Waals forces, hydrogen bonding, coulombic forces or dipole-dipole interactions, making removal of the contaminants difficult.

In certain instances, the presence of surface contaminants renders the contaminated substrate less efficient or inoperable for the substrate's designated purpose. For example, in certain precise scientific measurement devices, accuracy is lost when optical lenses or mirrors in the devices become coated with microfine surface contaminants. Similarly in semiconductors, surface defects due to minor molecular contaminants often render semiconductor masks or chips worthless. Reducing the number of molecular surface defects in a quartz semiconductor mask by even a small amount can radically improve semiconductor chip production yields. Similarly, removing molecular surface contaminants, such as Carbon or oxygen, from the surface of silicon wafers before circuit layers are deposited on the wafer or between deposition of layers significantly improves the quality of the computer chip produced.

Moreover, a significant portion of the debris that ultimately contaminates silicon wafers during production emanates from production apparatus such as process chambers in which the wafers are placed and pipes that conduct processing gas to the chambers. Accordingly, the level of wafer contamination experienced during the course of production can be significantly reduced by the periodic cleaning of such apparatus.

The need for clean surfaces free of even the finest contaminants has led to the development of a variety of surface cleaning methods. These known methods, however, each have serious drawbacks. For example, wet chemical cleaning eliminates metal ions and soluble impurities, but fails to remove particulates. Conversely, scrubbing techniques eliminate particulate, but employ devices that require regular maintenance and risk damaging the treatment surface due to physical contact. Similarly, pressurized fluid jet cleaning facilitates removal of particulates but risks damaging treatment surfaces due to the high pressure at which the cleaning fluid is maintained. Further, this technique may electrostatically damage the treatment surface due to the presence of ions in the cleaning fluid. Ultrasonic cleaning is a technique that may also result in physical damage to the treatment surface due to the intensity of sound waves being conveyed in the liquid medium. Additionally, "Megasonics," a high pressure chemical delivery system, may contaminate treatment surfaces with the contents of the very chemical solutions intended to remove contaminant. Similarly, strippable polymer tape may also contaminate treatment surfaces by depositing a polymer residue thereon. Finally, like "Megasonics" and polymer tape, each of the foregoing cleaning techniques employ cleaning tools and/or agents that can introduce as many new contaminants to a treatment surface as they remove.

Another known method for cleaning substrate surfaces without outside agents requires that the treatment surface be melted to release contaminants which are then removed by ultra high vacuum. This method has the disadvantage that the surface being treated must be briefly melted. Such melting may be undesirable, as for example when a semiconductor surface is cleaned between deposition of circuit layers and it is desired that the integrity of the previously deposited layers not be disturbed. Further, such an operation would be difficult if not impossible to implement for cleaning expansive, irregular surfaces, such as those found in pipes and wafer processing chambers. Finally, the ultra high vacuum equipment used in this process is both expensive and time consuming to operate.

Annealing treatment methods suffer similar drawbacks. When a surface is cleaned by annealing methods, the treatment surface of the substrate being cleaned is heated to a temperature that is generally below the melting point of the material being treated but high enough to enable rearrangement of the material's molecular crystal structure. The surface being treated is held at this elevated temperature for an extended period during which time the surface molecular crystal structure is rearranged and contaminants are removed by ultra high vacuum. Annealing cleaning methods cannot be used where it is desired to maintain the molecular crystal structure of the substrate surfaces.

Another currently utilized cleaning method, known as ablation, suffers from its own particular drawbacks. With ablation, a surface or contaminants on a surface are heated to the point of vaporization. Depending on the material being ablated, the material may melt before being vaporized or the material may sublimate directly on heating. With ablation cleaning techniques, if damage to the treatment surface is to be prevented, the ablation energy must be applied accurately to the contaminants only, rather than the surface on which the contaminants lie, a difficult task when the contaminants are extremely small or randomly spaced, or when the surface being treated is irregularly shaped. Even where the ablation energy can be successfully applied only to the contaminant, it is difficult to vaporize the contaminant without also damaging the underlying treatment surface.

Surface cleaning by melting, annealing and ablation can be conducted with a laser energy source. However, using a laser energy source to remove contaminants from a surface by melting, annealing or ablation does not overcome the inherent disadvantages of these processes. For example, in U.S. Pat. No. 4,292,093, "Method Using Laser Irradiation For the Production of Atomically Clean Crystalline Silicon and Germanium Surfaces" the laser annealing method disclosed requires both vacuum conditions and energy levels sufficient to cause rearrangement and melting of the treatment surface. Other known laser surface cleaning methods involving melting or annealing require similar high energy lasing and/or vacuum conditions, as disclosed in U.S. Pat. Nos. 4,181,538 and 4,680,616. Similarly the laser ablation technique disclosed in U.S. Pat. No. 3,464,534, "Laser Eraser" suffers the same drawbacks as other high energy ablation methods.

SUMMARY OF THE INVENTION

The invention solves the problems and avoids the drawbacks of the prior art by removing surface contaminants from the surface of a substrate without altering the molecular crystal structure or otherwise damaging the surface being treated. Gas is flowed across the substrate treatment surface and the substrate is continuously irradiated at an energy density and duration great enough to release surface contaminants from the substrate treatment surface and small enough not to alter the molecular crystal structure of the substrate treatment surface. The irradiation source may be any means known in the art such as a pulsed or continuous wave laser or high-energy lamp. Preferably the radiation is generated by a pulsed ultraviolet laser. The invention can be beneficially applied for removing surface contaminants from a generally planar semiconductor substrate before, between and after deposition of the circuitry layers on the semiconductor substrate. It may also be applied to irregularly shaped surfaces or, more specifically, surfaces lying in non-coincidently related planes. Such planes encompass all possible relationships between the surfaces of a substrate except those occupying the same space or plane. For example, surfaces that are parallel or angularly related, such as opposing interior walls of a pipe or adjacent walls in a cubical chamber, respectively, occupy non-coincidently related planes.

BRIEF DESCRIPTION OF THE DRAWINGS

FIG. 4 is a schematic diagram showing the use of a mask in combination with radiation and gas applied in accordance with the invention to remove contaminant from relatively planar treatment surfaces.

FIGS. 6 through 11 are schematic end views of apparatuses for conveying gas and radiation to irregularly shaped treatment surfaces according to the principles of the invention.

DETAILED DESCRIPTION

Figure 1:
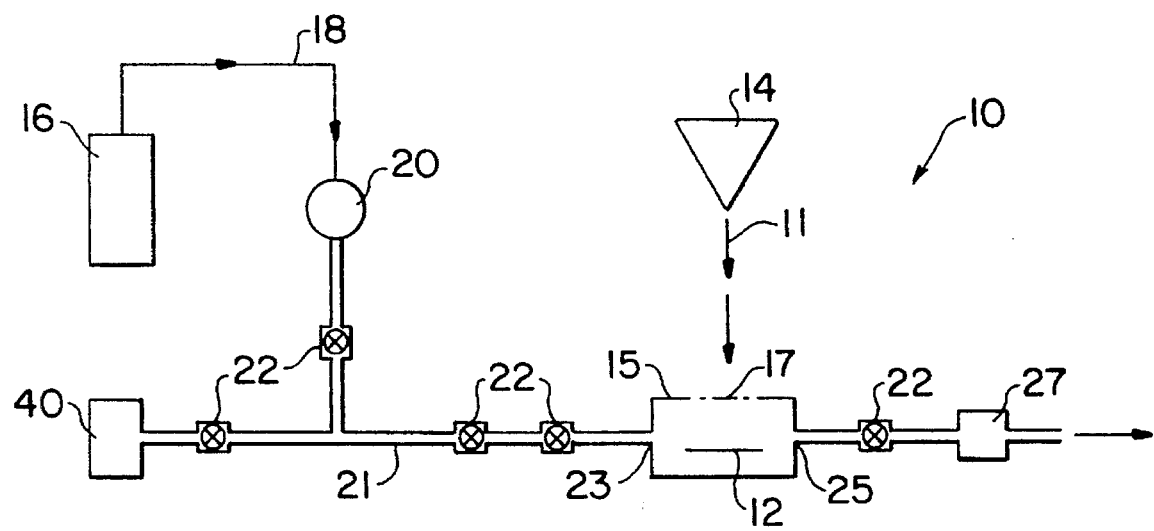
FIG. 1 is a schematic diagram of a contaminant removal method and apparatus according to the invention.

Reference will now be made in detail to presently preferred embodiments of the invention, examples of which are illustrated in the accompanying drawings. Throughout the drawings, like reference characters are used to designate like elements.

1. Treatment Method

A method and apparatus for removing surface contaminants from the surface of a substrate without altering the molecular crystal structure or otherwise damaging the substrate surface is illustrated schematically in FIG. 1. As shown in FIG. 1, an assembly 10 holds a substrate 12 from which surface contaminants are to be removed. A gas 18 from gas source 16 is constantly flowed over substrate 12. Gas 18 is inert to substrate 12 and is flowed across substrate 12 so as to bathe substrate 12 in a non-reactive gas environment. Preferably, gas 18 is a chemically inert gas such as helium, nitrogen or argon. An enclosure 15 for holding substrate 12 communicates with gas source 16 through a series of tubes 21, valves 22, and a gas flow meter 20.

According to the embodiment of the invention shown in FIG. 1, enclosure 15 comprises a stainless steel sample reaction cell fitted with opposing gas inlet and outlet ports 23, 25 respectively. Enclosure 15 is fitted with a sealed optical grade quartz window 17 through which radiation can pass. Inlet and outlet ports 23, 25 may comprise, for example, stainless steel tubing fitted with valves. After sample 12 is placed in enclosure 15, enclosure 15 is repeatedly flushed and backfilled with gas 18 and is kept at a pressure slightly above ambient atmospheric pressure to prevent inflow of other gases. Although enclosure 15 is shown as a solid chamber, it is anticipated that a surface being cleaned could be enclosed in any type of enclosure through which a gas can be flowed. For example, if the surface being treated is a large fixed object, a large portable enclosure such as a plastic bag might be utilized.

Flow of gas 18 may be regulated by flow meter 20 which, in the preferred embodiment, is a Matheson Model 602 flow meter. Valves 22 are preferably metering, regulating or bellows valves suitable for high temperature and pressure applications and for use with toxic, hazardous, corrosive or expansive gases or liquids, as for example "Swagelok SS-4H"™ series valves by Swagelok Co. of Solon, Ohio. Valves 22 can be opened or closed to isolate enclosure 15, to place enclosure 15 in communication with gas source 16 or to place enclosure 15 in communication with another substance, such as a gas for depositing on substrate 12, coming from an alternate source 40.

According to the method of the invention, high-energy radiation is irradiated upon the substrate treatment surface at an energy density and duration between that required to release surface contaminants from the substrate treatment surface and that which will alter the molecular crystal structure of the surface. According to the embodiment of the invention shown in FIG. 1, a radiation source 14 which may be a laser or high-energy lamp generates radiation 11 directed against the treatment surface of substrate 12. In FIG. 1, source 14 is shown as being outside enclosure 15 and irradiating sample 12 through quartz window 17. However, it is contemplated that source 14 could alternatively be placed within the enclosure 15.

The energy flux and the wavelength of the high-energy irradiation are preferably selected to be dependent upon the surface contaminants being removed. To this end, a gas analyzer 27 may be connected to outlet port 25. Analyzer 27 analyzes the contents of exhaust gas from enclosure 15 to facilitate selective energy and wavelength adjustment of source 14. Gas analyzer 27 may be a mass spectrometer as, for example, a quadrapole mass spectrometer manufactured by Bruker Instruments, Inc. of Billerica, Mass. or by Perkin Elmer of Eden Prairie, Minn.

Selection of the source of irradiation used in the invention depends upon the desired radiation energy and wavelength. The energy level of the radiation in electron volts/photon (Ev/photon) is preferably at least twice the energy necessary to break the bonds adhering the contaminants to the surface being cleaned. The bond energies between common contaminants (such as carbon and oxygen) and common substrate materials (such as silicon, titanium, germanium, iron, platinum and aluminum) range between 2 and 7 Ev/bond, as disclosed in Handbook of Chemistry and Physics, 68th ed., pp. F-169 to F-177 (CRC Press 1987). Accordingly, radiation sources emitting photons with energies in the range of 4 to 14 Ev/photons are desirable. The wavelength should be below the wavelength that would compromise the integrity of the substrate surface by the well-known photoelectric effect, as described in G. W. Castellan, *Physical Chemistry*, 2d ed., 458–459 (Academic Press, 1975) which is hereby incorporated by reference. The preferred wavelength depends on the molecular species being removed and the resonance states of such species.

Any means known in the art for generating radiation of a suitable energy level may be used in the invention, including high-energy lamps and lasers. Depending upon the application, it is anticipated that light energy from such sources may range from deep ultraviolet to infrared, with corresponding wavelengths from 193–3000 nm, respectively.

The wavelengths and photon energies of a number of suitable lasers are listed in Table 1, below.

TABLE I

| Laser | Wavelength (nm) | Ev/photon |
|---|---|---|
| XeCl, pulsed | 308 | 4.04 |
| argon-ion, continuous wave | 257 | 4.83 |
| KrF, pulsed | 248 | 5.01 |
| ArF, pulsed | 193 | 6.44 |
| Tunable dye lasers, pulsed or continuous wave | 200–800 | 6.22–1.55 |

These lasers are described in greater detail in the following references: M. J. Webber, ed., *CRC Handbook of Laser Science*, Vols. 1–5 (1982–1987); Mitsuo Maeda, *Laser Dyes* (Academic Press 1984); and laser product literature from Lambda Physik at 289 Great Road, Acton, Mass., Coherent, Inc. at 3210 Porter Drive, Palo Alto, Calif., and Spectra-Physics at 1250 West Middlefield Road, Mountain View, Calif. It is anticipated that high-energy xenon or mercury lamps or other types of lasers, including visible, ultraviolet, infrared, x-ray or free electron lasers might be utilized as appropriate sources of radiation.

According to the invention, the irradiation directed against the substrate treatment surface from which contaminants are being removed has a power density less than that required to alter the molecular crystal structure of the surface. Preferably, the power density and duration of the irradiation are selected so as to impart an amount of energy on the substrate surface that is significantly below the energy required for alteration of the substrate surface structure. The preferred energy level is dependent on the composition of the substrate being treated. For example, with certain substrate materials such as plastics, this energy level would be much lower than for other materials such as high strength carbide steels. The heats of formation for various materials are well known and are reported in the *Handbook of Chemistry and Physics*, 68th ed., pp. D33–D42 (CRC Press 1987). The heat of formation generally corresponds to the amount of heat required to break down various materials and can be used as a guideline in selecting an irradiation energy density and duration that will not alter the molecular crystal structure of the treatment surface. The heats of formation of a number of common substrate materials are summarized in Table II, below.

TABLE II

| Material | Heat of Formation |
|---|---|
| $Al_2O_3$ | 16906.7 kJ/mol; 17.52 Ev/molecule |
| $SiO_2$ | 840.3 kJ/mol; 9.11 Ev/molecule |
| $Nb_2O_5$ | 1528.2 kJ/mol; 13.27 Ev/molecule |
| NiO | 230.6 kJ/mol; 2.50 Ev/molecule |
| $Ti_2O_3$ | 500.2 kJ/mol; 15.63 Ev/molecule |

The irradiation energy density and duration used in the present invention is such that the heat of formation is not approached on the substrate treatment surface. Finding the maximum energy usable on a given substrate material, however, will require some experimentation in light of the material's known heat of formation. Such experimentation ensures that annealing, ablation and melting will not occur.

When a substrate surface is irradiated as described above, the bonds and/or forces holding surface contaminants to the substrate surface are broken and the inert carrier gas carries contaminants away from the substrate surface during irradiation..As long as the cleaned substrate remains in the inert gas environment, new contaminants will not form on the substrate surface. If necessary, a suitable trapping system may be connected to enclosure outlet 25 for trapping and neutralizing removed contaminant species.

2. Planar Treatment Surfaces

Figure 2:
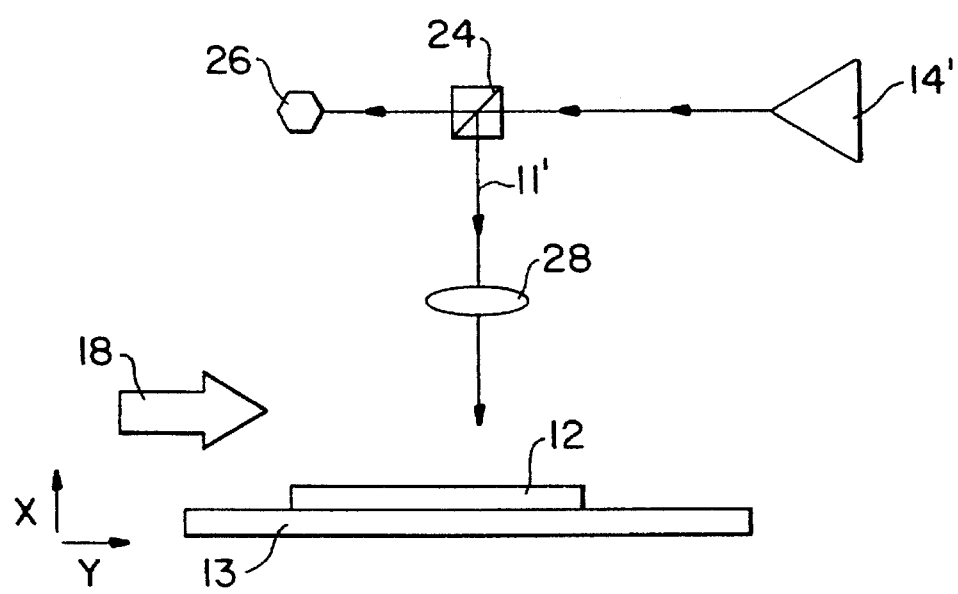
FIG. 2 is a schematic diagram showing how laser radiation is applied in one embodiment of the invention to remove contaminant from relatively planar treatment surfaces.
Figure 3:
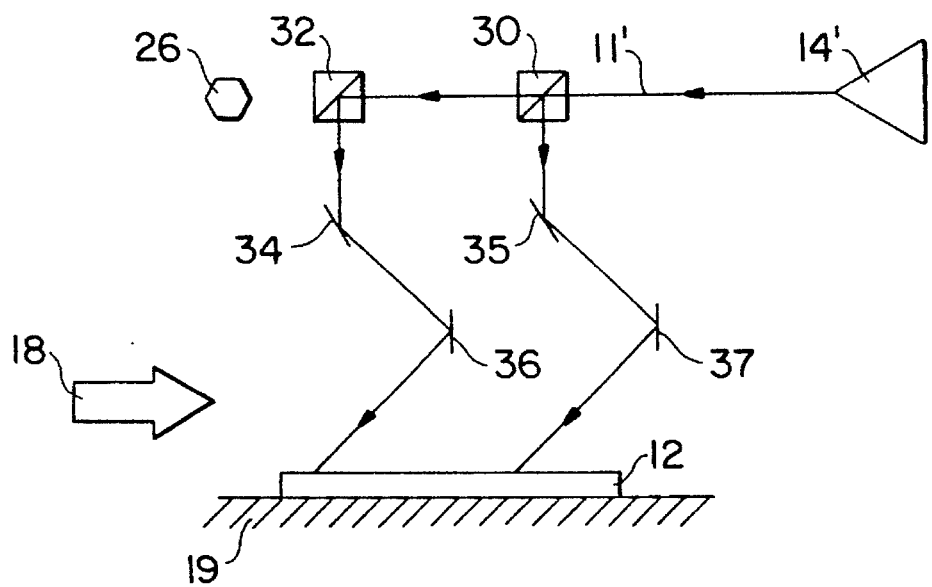
FIG. 3 is a schematic diagram showing how laser radiation is applied in another embodiment of the invention to remove contaminant from relatively planar treatment surfaces.

A planar substrate being treated in accordance with the invention may be selectively irradiated with a laser. As shown in FIG. 2, for example, substrate 12 is fixed on an XY table 13, which is selectively moved with respect to a fixed beam of laser pulses 11' that are generated by a laser 14', directed through a beam splitter 24 and a focusing lens 28 before contacting selected portions of the surface of substrate 12 over which inert gas 18 flows. Alternatively, as shown in FIG. 3, laser pulses 11' may be split by beam splitters 30, 32 into two sets of pulses which are selectively moved by adjusting mirrors 34–37 over the surface of substrate 12 on a fixed table 19. A laser power meter 26, measuring energy directly from the laser, allows for close monitoring of the laser power being applied to the substrate. Suitable laser power meters are available from Digirad of Oriskany, N.Y. and Scientech, Inc. of Boulder, Colo.

Furthermore, selective irradiation of a planar surface may be achieved through the use of a mask, similar to that used in the semiconductor industry, placed between the source of radiation and the treated substrate. As shown in FIG. 4, mask 9 facilitates selective irradiation of substrate 12 secured to fixed table 19 by limiting access of radiation 11 to substrate 12 through mask passages a. As detailed in FIG. 1, enclosure 15 comprises a stainless steel sample reaction cell fitted with opposing gas inlet and outlet ports 23, 25, respectively, and sealed optical grade quartz window 17 through which radiation can pass.

It is anticipated that high-energy lamps may also be used to irradiate planar surfaces in configurations similar to that disclosed in FIGS. 2 through 4.

The following examples illustrate application of the method of the invention on generally planar treatment surfaces. In Example I, various energy densities of a pulsed KrF excimer laser are applied to a silicon oxide substrate with varying degrees of success. In Example II, the need for the invention in the area of optical components is examined.

EXAMPLE I

The native oxide of silicon is necessary for the promotion of thin film growth on semiconductor surfaces. Unfortunately, when semiconductor surfaces of silicon oxide are exposed to the environment, carbon contaminants adhere weakly to the semiconductor surface. The presence of these contaminants greatly reduces the conductivity or the insulating nature of the thin film to be deposited. Therefore, in semiconductor production, great precautions are taken to minimize environmental exposure through the use of elaborate vacuum, chemical and mechanical techniques. Vacuum techniques are expensive especially if high or near ultra high vacuum is used to keep surfaces clean between processing steps. Chemical (wet and dry) and mechanical techniques can damage the substrate treatment surface and, if the substrate being treated is a processed integrated circuit, the underlying structure.

In an attempt to overcome these problems, radiation from a pulsed KrF excimer laser whose fundamental wavelength is 248 nm (UV range) was applied to the surface of a silicon substrate in a sealed box through which argon gas was flowed. To decrease surface carbon contamination and decrease carbon percentage associated with chemisorbed organometallic (trimethyl aluminum), a precursor to aluminum thin film formation in semiconductor production, irradiation of 35 mj/cm$^2$ for 6000 laser shots at a 10 Hz repetition rate was applied to a silicon oxide substrate surface with the KrF excimer laser. The laser treated surfaces were exposed during a continuous flow of argon gas at a flow rate of 16 l/hr under a 1.03×10$^3$ torr backing regulator pressure. After treatment, X-ray Photoelectron Spectroscopy ("XPS") analysis showed the substrate exhibited a significant decrease in surface carbon from a pretreatment average surface carbon covering 30–45% of the substrate surface to an after treatment average surface carbon covering 19% of the substrate surface. The substrate surface itself showed no damage or alteration.

A surface treated by a laser irradiation as described above and then exposed to an organometallic gas flow showed, by XPS analysis, that 20.8% of the substrate surface was covered with carbon as compared to 40–45% of the substrate surface that was covered with carbon after organometallic gas exposure on a non-laser treated surface. When the laser was applied, as described above, both prior to exposure to organometallic gas and again after gas exposure, only 8.9% of the surface was covered with carbon. Areas adjacent to the laser-exposed areas also exhibited some effects of the laser-cleaning treatment. Areas adjacent to the treated area showed a reduced carbon level of 12.7 percent. This effect probably is due to the gaussian nature of the applied laser pulse.

Transfer of the wafer from the sample cell to the XPS analyzer was via an argon filled glove box. The silicon wafer was transferred to the XPS through an inert UHV transfer rod. This kept environmental exposure to a minimum.

Another wafer of silicon oxide, while exposed to argon gas as described above, was exposed to pulsed KrF excimer laser irradiation of 9 mj/cm$^2$ for 6000 shots at a 10 Hz repetition rate. XPS analysis showed a surface carbon coverage of 40–45% both before and after laser treatment. Thus, irradiation at 9 mj/cm$^2$ did not remove adsorbed surface carbon.

Another wafer or silicon oxide, while exposed to argon gas as described above, was exposed to pulsed KrF excimer laser irradiation of 300 mj/cm$^2$ for 6000 shots at a 10 Hz repetition rate. At the end of treatment, the substrate surface had suffered significant damage, including a hole through the substrate. Thus, irradiation at 300 mj/cm$^2$ altered the molecular crystal structure of the substrate surface.

These examples show laser irradiation at an appropriate energy flux and wavelength can decrease surface contamination without damaging underlying surface or adjacent structures.

It is expected, in view of the heat of formation of $SiO_2$, that subjecting a silicon oxide substrate surface to pulsed KrF excimer laser irradiation of less than 100 mj/cm$^2$ for 6000 shots at a 10 Hz repetition rate would not alter the molecular crystal structure of the substrate. Pulsed KrF excimer laser irradiation of less than 75 mj/cm$^2$ for 6000 shots at a 10 Hz repetition rate is not expected to alter a silicon oxide substrate surface in any way.

EXAMPLE II

High energy optical components are difficult to fabricate for such technologies as laser fusion, x-ray lithography and UV excimer laser optics. Laser fusion and x-ray lithography technologies are used exclusively in "clean" environments. Excimer laser optics have a short work life span because with current commercial film deposition technology, it is difficult to fabricate films capable of withstanding prolonged high-energy fluxes.

A perennial problem with high energy optics is optical breakdown. This phenomena can be described as "the catastrophic evolution of damage inflicted in a transparent medium in a strong laser field." Y. R. Shen, *Principles of Nonlinear Optics,* 1st ed., 528–540 (Wiley Interscience 1984). This phenomena occurs in solids as well as gases. With a solid, such as a high energy optic, optical breakdown is exacerbated by the presence of a surface defect such as scratches and pores in the bulk material. In most cases, optical breakdown is due to surface contamination such as adsorbed dust particles. The presence of these contaminants lowers the breakdown threshold which in turn limits the maximum laser power that can be used from a given laser system. This fact is a very important limitation regarding the pumping of a laser medium (solid state or gaseous) by an external pump energy source. This, in turn, limits the laser power that can be used to transmit energy through optical windows, lenses and other optical components.

Optical breakdown, for example on a solid, is promoted by the presence of surface adhered contaminants. The interaction of a laser pulse train with a sufficient energy cross section may deposit enough energy to generate an "avalanche" ionization on the solid surface. This can form a surface plasma which may disintegrate the solid. The presence of contaminants effectively decreases the laser's efficiency and decreases its use in potential applications.

To overcome the above described problems, the contaminant removal method, as described herein, can be used to remove adhered contaminants such as adsorbed dust. For example, to treat an optical component, the component is exposed to a continuous flow of argon gas during which time a pulse KrF excimer laser is directed at the surface of the optical component. The laser is tuned to an appropriate energy-flux and wavelength that is considerably less than the high energy pulse required to promote ionization and subsequent plasma in high energy optics. The optical component surface is irradiated at the selected flux and wavelength for a duration sufficient to remove adsorbed contaminants.

2. Irregularly Shaped Treatment Surfaces

The embodiments disclosed in FIGS. 2 through 4 are directed primarily towards the treatment of planar or flat substrates, such as silicon wafers. Accordingly, their application is restricted to those substrate surfaces that may be conveniently secured within a process chamber and configured to permit adequate exposure to a source of radiation emanating from a generally fixed location.

Alternatively, FIGS. 5 through 26 disclose embodiments of the invention capable of removing surface contaminants from objects having irregularly shaped internal and external substrate surfaces or, more specifically, surfaces that lie in non-coincidently related planes. Such planes encompass all possible relationships between the surfaces of a substrate except those occupying the same space or plane. For example, surfaces that are parallel or angularly related, such as opposing interior walls of a pipe or adjacent walls in a cubical chamber, respectively, occupy non-coincidently related planes.

Significantly, the apparatuses disclosed in FIGS. 2 through 4 are incapable of treating such substrate surfaces. These apparatuses are strictly limited to singularly planar substrates. Conversely, the apparatuses in FIGS. 5 through 26 may effectively treat surfaces occupying non-coincidently related planes either sequentially or simultaneously, as discussed more fully below.

Although not shown in these figures, a gas analyzer 27, such as that described above, and/or particle detector may be incorporated into these embodiments to facilitate selective energy and wavelength adjustment of source 14 as described above. Suitable particle detectors may be obtained from Particle Measuring Systems, Inc. of Boulder, Colo. and Tencor Instruments of Mountain View, Calif.

Figure 5:
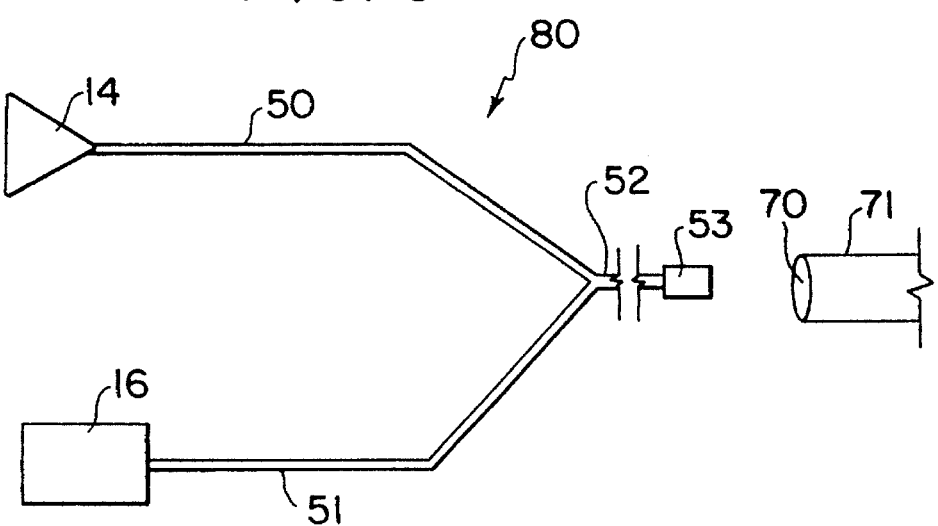
FIG. 5 is a schematic diagram of a contaminant removal apparatus for removing contaminant from irregularly shaped treatment surfaces according to the invention.

FIG. 5 schematically illustrates an apparatus 80 for removing contaminants from elongated enclosed passages, such as pipes 71. Radiation from a radiation source 14 is conducted through a radiation conduit 50, which is an optical waveguide such as a bundle of optical fibers or light pipe, while a gas inert to the substrate treatment surface is conducted from gas source 16 to the treatment surface via gas line 51. Radiation conduit 50 and gas line 51 merge at or before cable head 53, where they may be "bundled" into a single cable 52. Cable head 53, connected to the end of cable 52, includes radiation passages 54 (which may be one or more optical fibers) and gas passages 55. Various configurations of cable head 53 are illustrated in cross section in FIGS. 6–11.

The geometric shape and configuration of radiation passages 54 and gas passages 55 at the end of cable head 53 may be selected based upon the intensity and distribution of radiation and/or gas turbulence required for a particular application (i.e., elongated enclosed passages or more expansive, planar surfaces). For example, FIGS. 6 and 7 disclose configurations that are biased toward enhanced radiation exposure and gas turbulence, respectively. Further, FIGS. 6–9 provide geometries that convey an uneven amount of gas and/or radiation as they repeatedly pass normally over a surface. These are contrasted with the even distribution of gas and radiation provided by FIGS. 10 and 11 when directed normally to a surface. Alternatively, FIGS. 8 and 9 provide a relatively uniform distribution of gas and radiation when applied to surfaces generally parallel to the axis of cable head 53, as discussed more specifically below. Although gas and radiation control is enhanced through the use of cable head 53, it is anticipated that in certain applications this element may be eliminated altogether, allowing gas and radiation to simply emanate directly from the ends of gas conduit 51 and radiation conduit 50.

In addition to facilitating multiple radiation passages 54 and gas passages 55, cable head 53 provides means for redirecting the radiation and gas to substrate treatment surface 70. Such redirection is necessary when apparatus 80 is used for cleaning the interiors of narrow passages such as pipes 71, as shown in FIGS. 12 and 13, where the axis of cable head 53 must be generally parallel to the treatment surface 70.

Figure 15:
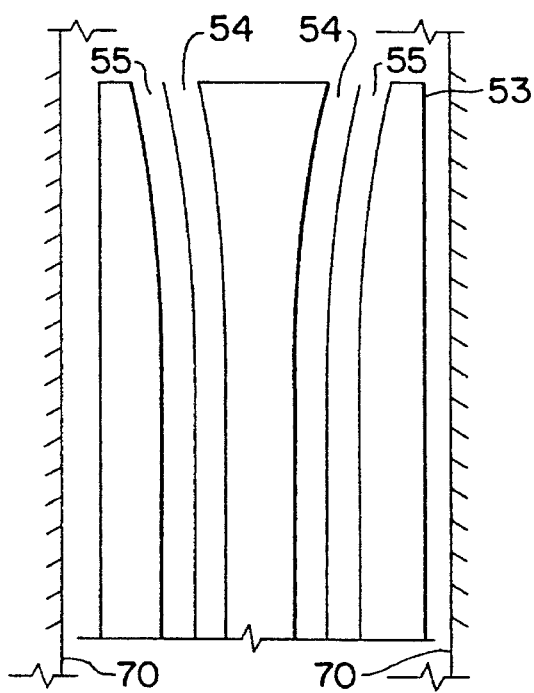
FIG. 15 is a partial plan view of the apparatus illustrated in FIG. 14.
Figure 16:
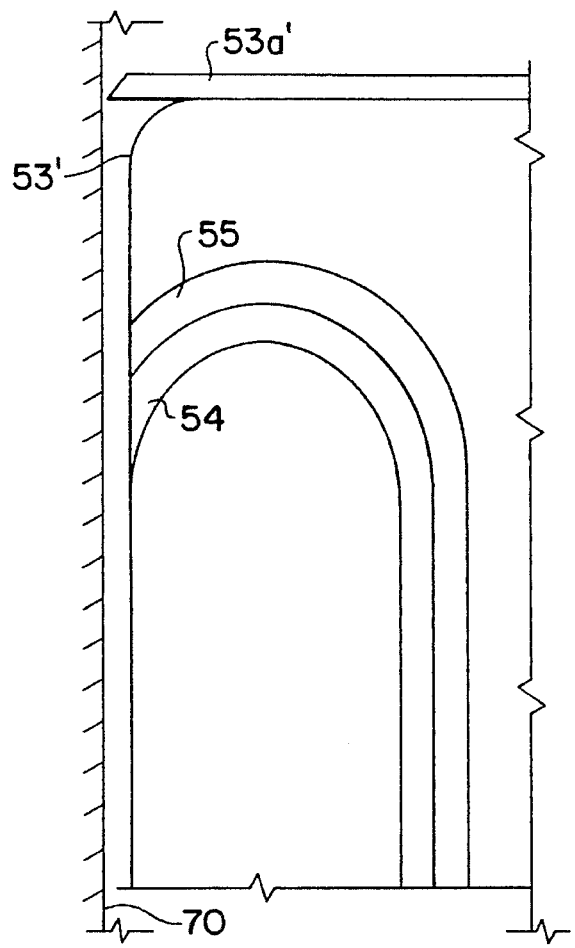
FIG. 16 is a partial plan view of another configuration of an apparatus for conveying gas and radiation to irregularly shaped treatment surfaces according to the principles of the invention.

As shown in FIG. 15, radiation passage 54 and gas passage 55 flare outwardly from the centerline of cable head 53, thereby directing both the radiation and gas flow toward the inner walls of the passage to be cleaned. The angle of the flare from the centerline of cable head 53 may range from only a few degrees to more than 90° as shown in FIGS. 15 and 16, respectively. The configuration of cable head 53 is application-specific, related to gas flow rate and photon delivery requirements for contaminant removal. More specifically, cable head 53 directs radiation at the appropriate density and angle of incidence for a particular contaminant and substrate while maintaining a continuous flow of inert gas across that portion of the substrate being irradiated.

Figure 12:
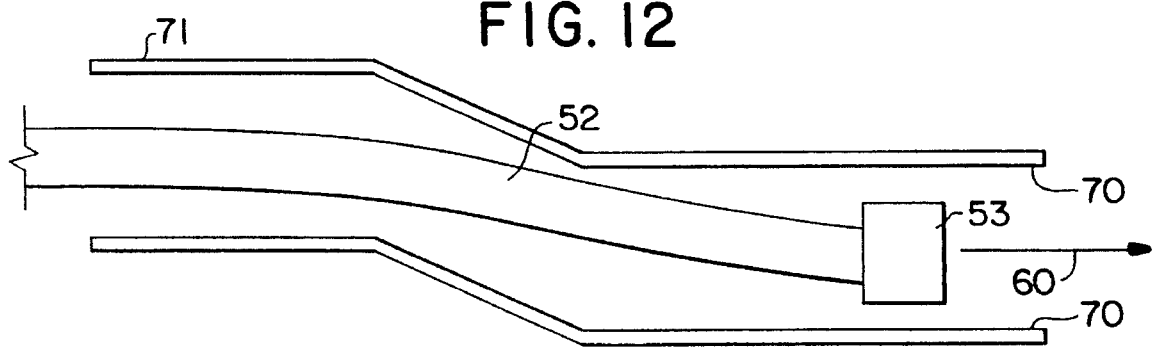
FIGS. 12 and 13 are schematic side views showing how the invention of FIG. 5 may be applied to remove contaminant from the interiors of elongated, enclosed passages.
Figure 13:
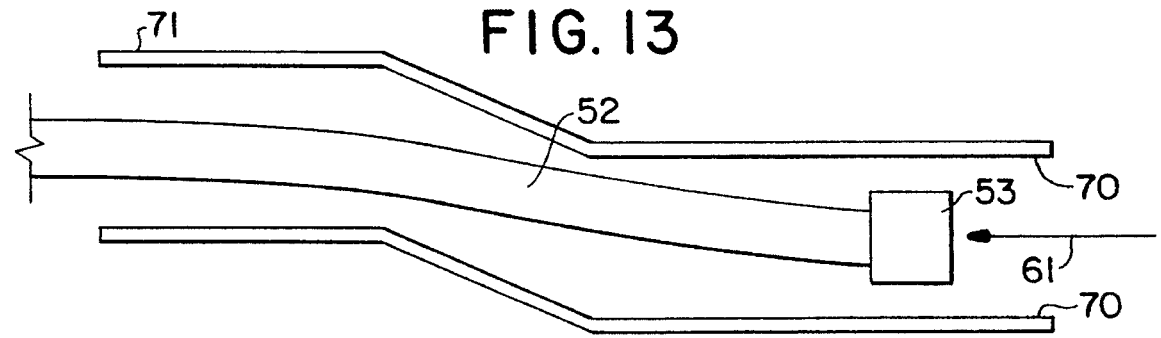

In operation, apparatus 80, and more specifically cable 52 and cable head 53, may traverse an elongated, enclosed passage 71 in either a forward or reverse direction, as shown in FIGS. 12 and 13, respectively. When moving forward, as denoted by arrow 60 in FIG. 12, cable head 53 may be configured as shown in FIG. 15. Radiation passage 54 and gas passage 55 may be disposed in the inner and outer passages, respectively, of cable head 53. In this way, the irradiation of substrate surface 70 from energy conveyed through radiation passage 54 will occur downstream from the flow of gas emanating from the discharge end of gas passage 55, and any dislodged contaminants will be continually pushed ahead of cable head 53 by discharged gas as the cable head moves forward.

Alternatively, cable head 53 may move in a reverse or backward direction denoted by arrow 61 of FIG. 13. When moving backwardly, cable head 53' may be configured as shown in FIG. 16. Radiation passage 54 and gas passage 55 may be disposed in the outer and inner passages, respectively, of cable head 53'. Gas discharged from gas passage 55 flows back along cable 52 in the annular space between the cable and pipe 71. In this way, the portion of substrate surface 70 being irradiated by energy conducted through radiation passage 54 will be blanketed by the gas, and any dislodged contaminants will be continually pushed by gas in the direction of movement of cable head 53' as the cable head moves backwardly along the pipe. To prevent contaminant-laden gas from passing into the portion of the pipe already treated, a cap may be placed at the end of the pipe nearest the portion first .treated. Alternatively, a cap 53a', as illustrated in FIG. 16, may be mounted on the end of the cable head 53'. This cap has an outside diameter slightly less than the inside diameter of pipe 71, so that the annular flow area between the cap and the pipe is much less than the annular flow area between pipe 71 and cable 52 or cable head 53'. The gas will therefore flow away from cap 53a' and toward cable 52.

Figure 14:
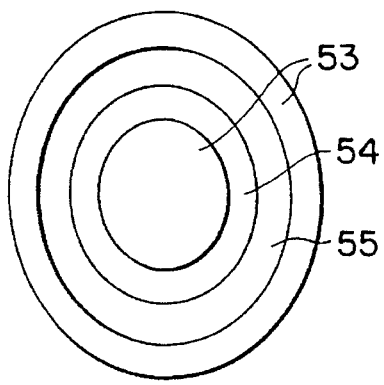
FIG. 14 is an schematic end view of an apparatus for conveying gas and radiation to irregularly shaped treatment surfaces according to the principles of the invention.

In both forward and backward moving configurations, the constant flow rate of the inert gas discharged from gas passage 55 is sufficient to move the contaminants away from the area of treatment. This flow of gas may also serve as a means for centering cable head 53 within elongated enclosed passages to be cleaned. As shown in FIGS. 14–16, gas passage 55 may be configured as an annular ring directed outwardly from the centerline of cable 52. Should sufficient gas pressure be applied, the uniform, outwardly directed gas from gas passage 55 may center cable head 53 within an elongated, enclosed passage.

Figure 17:
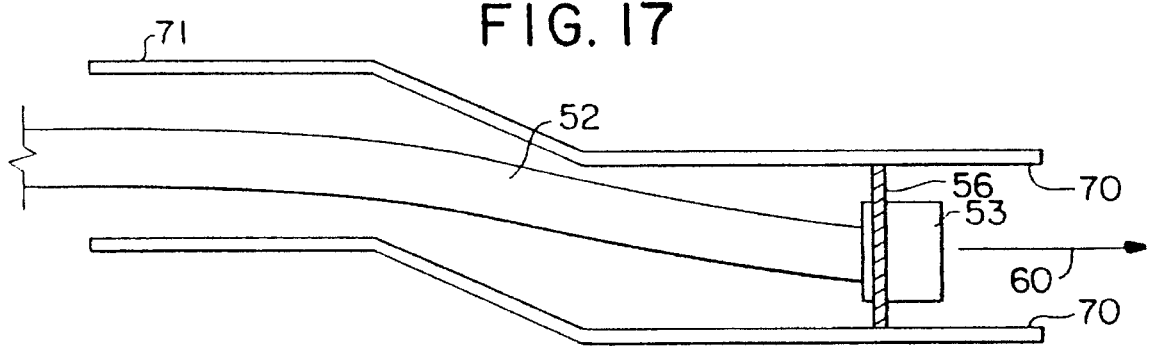
FIGS. 17 and 17a are schematic side views showing application of the invention of FIG. 5 with a flexible, porous centering support structure.
Figure 17A:
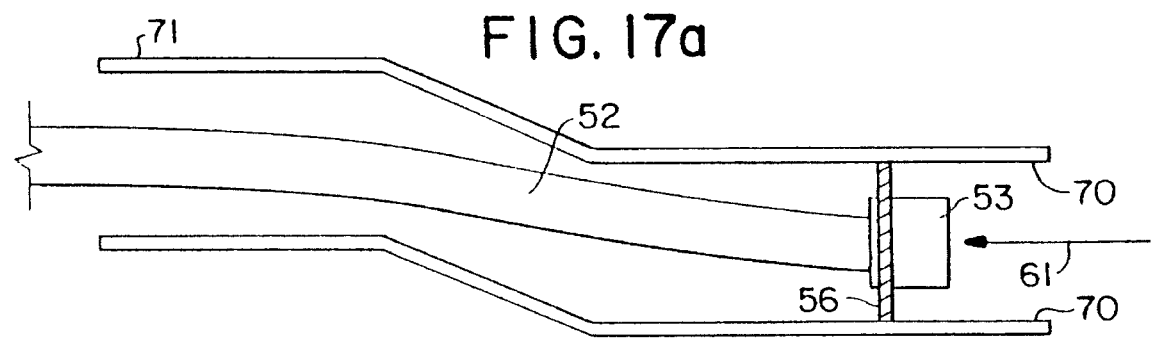
Figure 18:
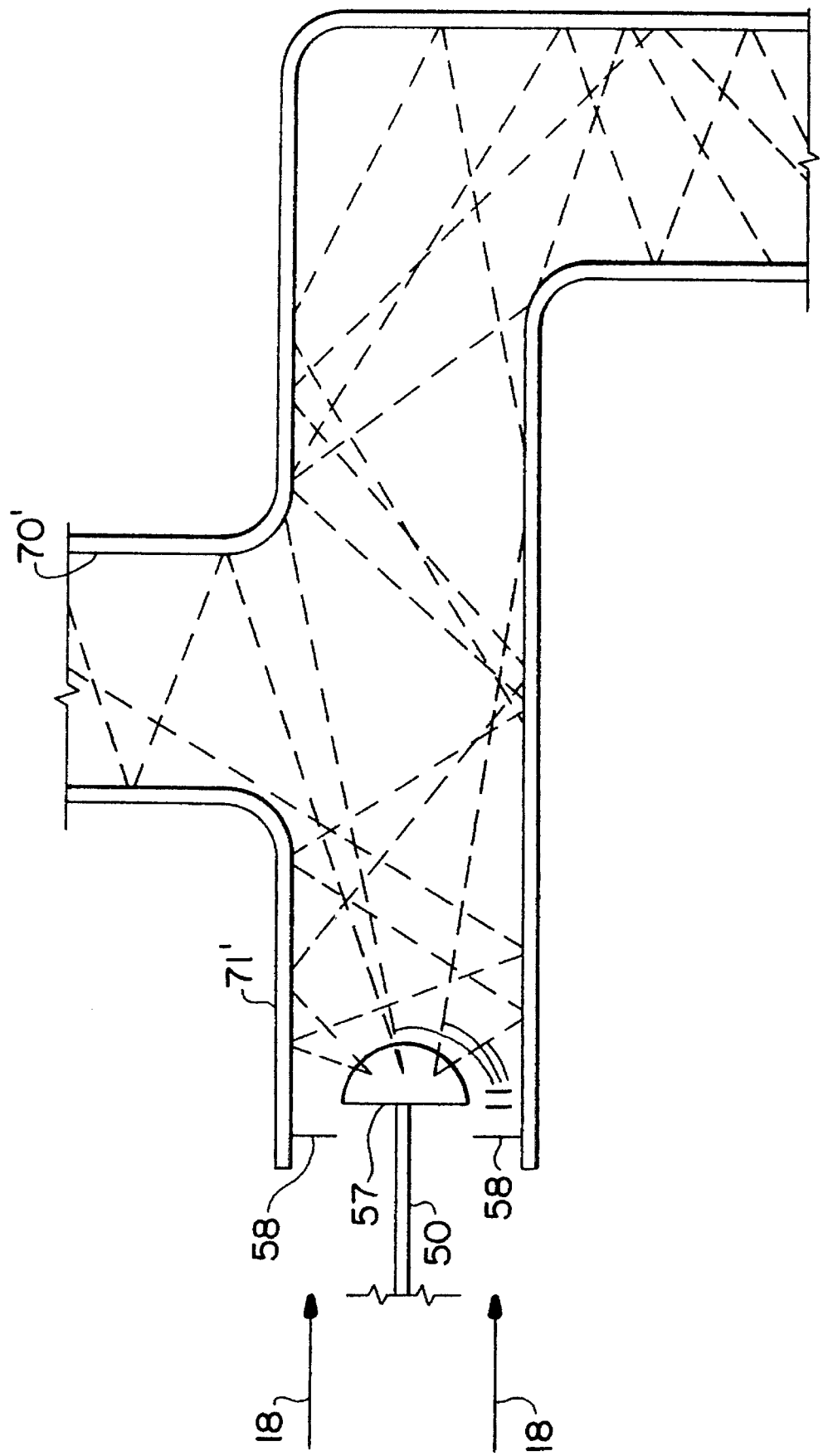
FIG. 18 is a schematic side view showing application of the invention with an optic diffuser.

Alternatively, flexible, porous support structure 56, composed of a stable and non-particle shedding material, may be placed around cable head 53 for centering purposes, as shown in FIGS. 17 and 17a. To avoid contaminating cleaned surfaces, support structure 56 should never contact treated surfaces, whether cable head 53 moves in a forward (arrow 60) or reverse (arrow 61) direction. Thus, support structure 56 should pass over the substrate surface ahead of the radiation treatment. In such an application, the structure must be sufficiently porous to allow gas and dislodged contaminant to flow through it as cable head 53 traverses the enclosed passage. In the forward moving embodiment shown in FIG. 17, gas passages 55 and radiation passages 54 (not shown) may exit from the side of cable head 53 rather than from its face as illustrated in FIGS. 14 and 15 to enable installation of support structure 56 downstream of gas and contaminant flow.

Where the interior of an elongated, enclosed passage is constructed from sufficiently reflective material, such as basic annealed 316 stainless steel, a high-energy lamp, or radiation conduit 50 with an optical diffuser 57 mounted to its end, may simply emit radiation 11 at the entrance to the passage and allow resulting radiation 11 to reflectively traverse the interior 70', as shown in FIG. 18. The interior 70' of elongated passage 71' is sufficiently reflective to enable radiation 11 to traverse the interior without moving the source of radiation. Inert gas flow 18, conveyed to the entrance of passage 71' by any means known in the art, ensures particulate is moved downstream once dislodged from substrate surface 70'. In addition, reflector 58, which may also be constructed from 316 stainless steel, is secured to the perimeter of the entrance of passage 71' to prevent back flow of radiation and gas.

It is also anticipated that a liquid, rather than a gas, may serve as the inert medium to carry away contaminants dislodged through irradiation from narrow, elongated passages. Such a modification would be particularly useful in the removal of plaque from the interior walls of blood vessels. In such an application, the applied radiation would be characterized by an energy density and duration between that required to release surface contaminants from the treatment surface and that which would not damage or traumatize the composition of the vascular structure.

Analogous to elongated, enclosed passages, apparatus 80, or more particularly cable 52 and cable head 53 may be utilized to clean more expansive interiors such as those of process chambers. In such instances, cable head 53 may be configured without a flare, so that radiation and inert gas are directed straight out the end of the cable along the cable axis. Manual or robotic control may be employed to guide the assembly as it sweeps across such surfaces.

Figure 19:
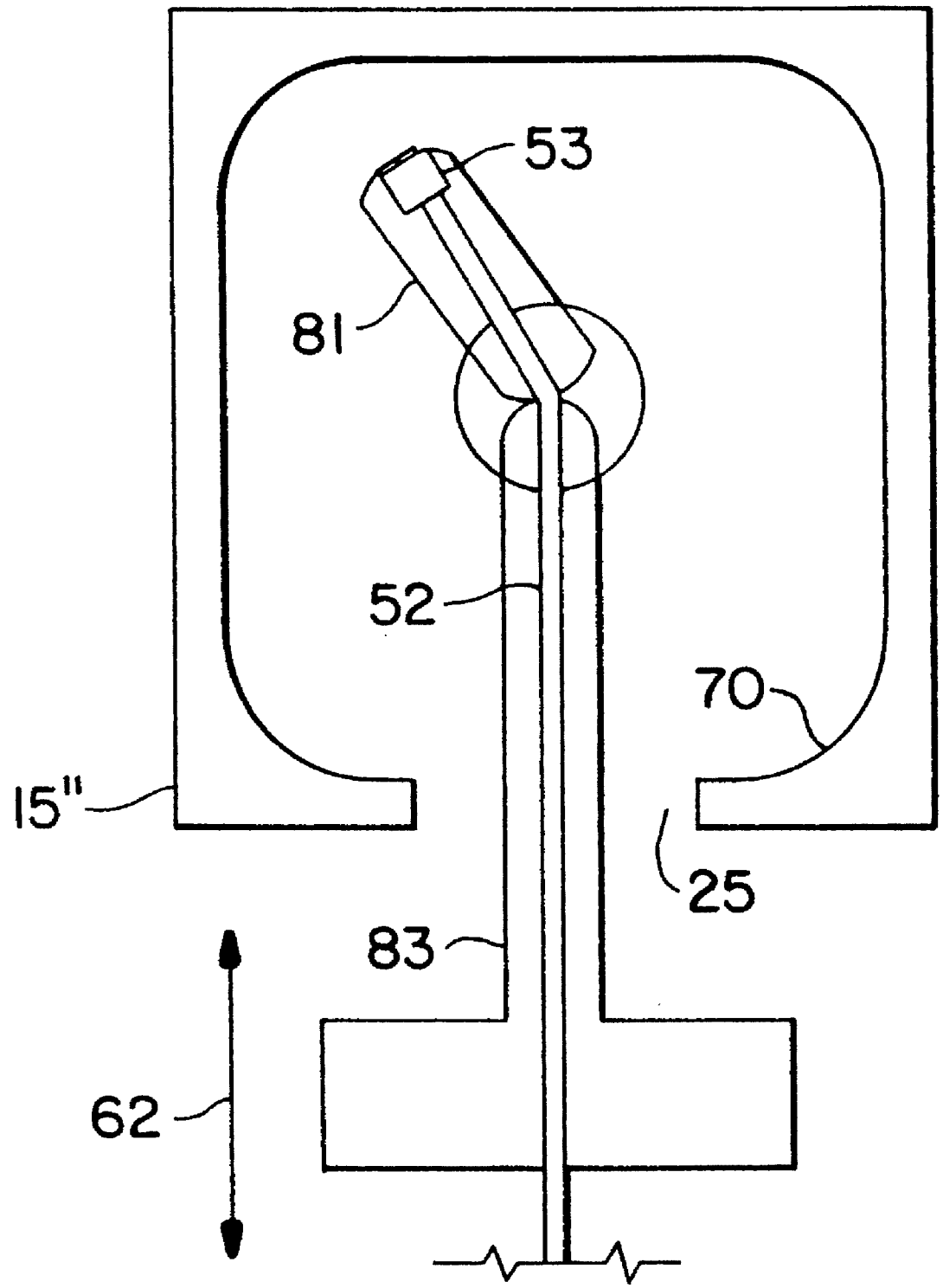
FIGS. 19 and 20 are schematic side views showing how the invention of FIG. 5 may be applied to remove contaminant from process chamber interiors.

In FIG. 19, for example, chamber 15" includes a gas inlet embodied in gas passage 55 of cable head 53, and gas outlet 25. Within the chamber, robotic arm 81 attached to base 83 provides means for moving cable head 53 about the interior walls of the chamber, identified as substrate treatment surface 70. The arm may spin a complete 360°, and base 83 may move up and down as denoted by arrow 62 providing complete access to the interior of the chamber. As radiation and gas are conveyed to substrate treatment surface 70 by means of passages 54 and 55 of cable head 53, contaminant is dislodged from the surface and is drawn to outlet 25 by means of gravity and gas flow.

Figure 20:
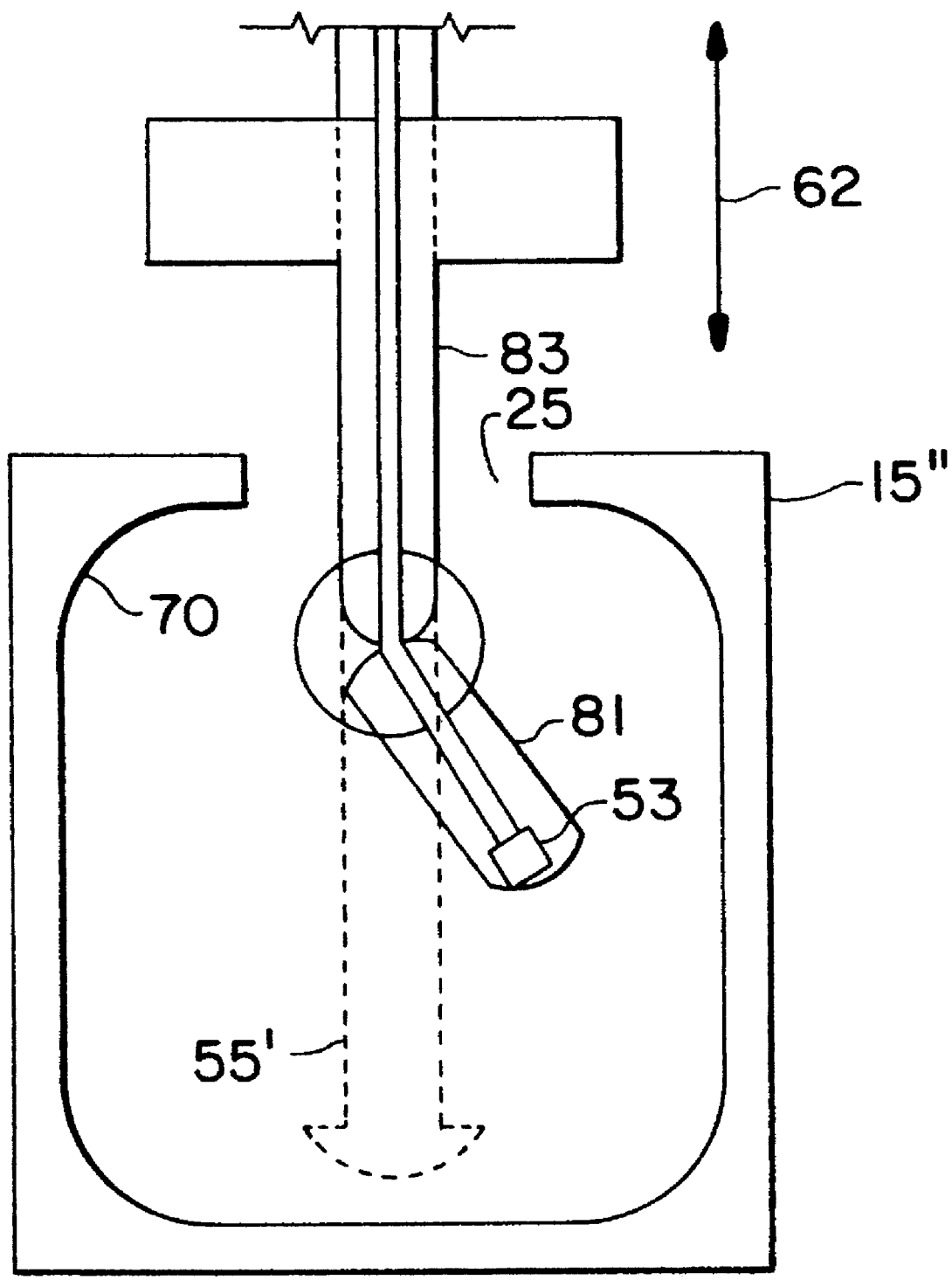

Alternatively, FIG. 20 illustrates a chamber cleaning arrangement wherein the gas outlet 25 is positioned at the top of the chamber. As in FIG. 19, robotic arm 81 attached to base 83 provides means for moving cable head 53 about the interior walls of the chamber. In this instance, however, gravity may not be relied upon to draw dislodged contaminant toward gas outlet 25. As such, a secondary gas flow is provided as indicated by arrow 55' to maintain a constant turbulence at the base of chamber 15". This secondary flow creates constant movement of gas toward outlet 25 extending the full depth of the chamber. Accordingly, as the substrate surface 70 is cleaned from bottom to top, contaminant is carried by the upward flowing gas stream produced by secondary flow 55' and expelled through outlet 25. It is anticipated that one or more secondary sources of gas may be added to chamber 15" to accommodate different chamber geometries and gas outlet positions (i.e., side mounting).

In addition to interiors, cable 52 and cable head 53 may be used to remove contaminant from exteriors of irregularly shaped objects. For example, in FIG. 21, chamber 15' is fitted with gas inlets 23 and outlets 25 to enable a bulk gas flow 18 to traverse the chamber. Within the chamber, robotic arm 81 attached to base 82 provides means for moving cable head 53 about object 72, which includes substrate treatment surface 70. Access to the entire surface 70 of object 72 is facilitated by turntable 84. Passages 54 and 55 within cable head 53 convey radiation and sufficient gas flow to the specific area being treated so to dislodge contaminant from substrate surface 70. Once dislodged from the treatment area, contaminant enters the bulk flow gas stream 18 and is removed from chamber 15' via gas outlet 25. As mentioned above, this exiting gas may be monitored through the use of a gas analyzer and/or particle detector to facilitate selective energy and wavelength adjustment of radiation source 14 (not shown).

Figure 21:
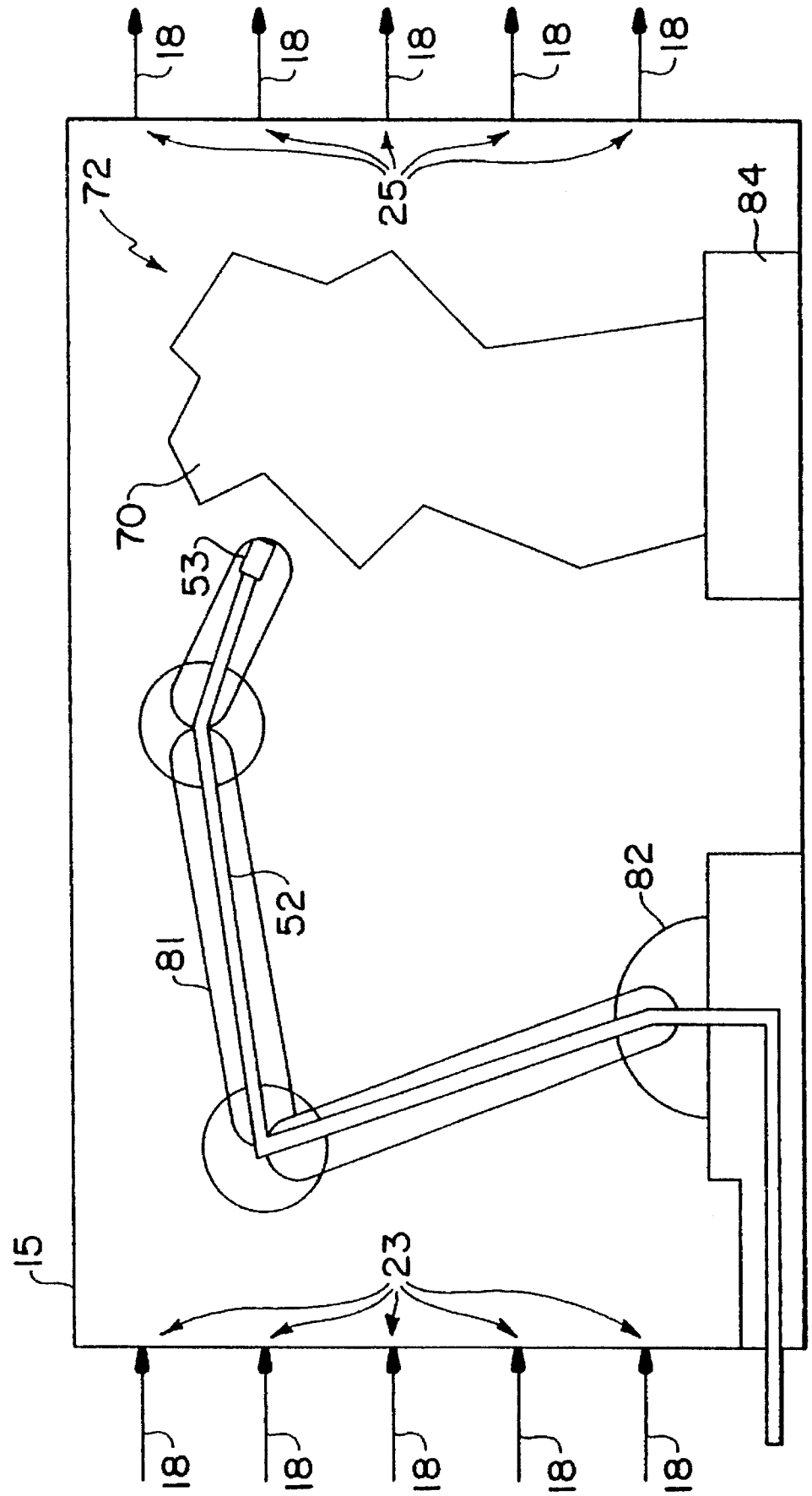
FIGS. 21 and 22 are schematic side views showing how the invention of FIG. 5 may be applied to remove contaminant from the exteriors of irregularly shaped objects.
Figure 22:
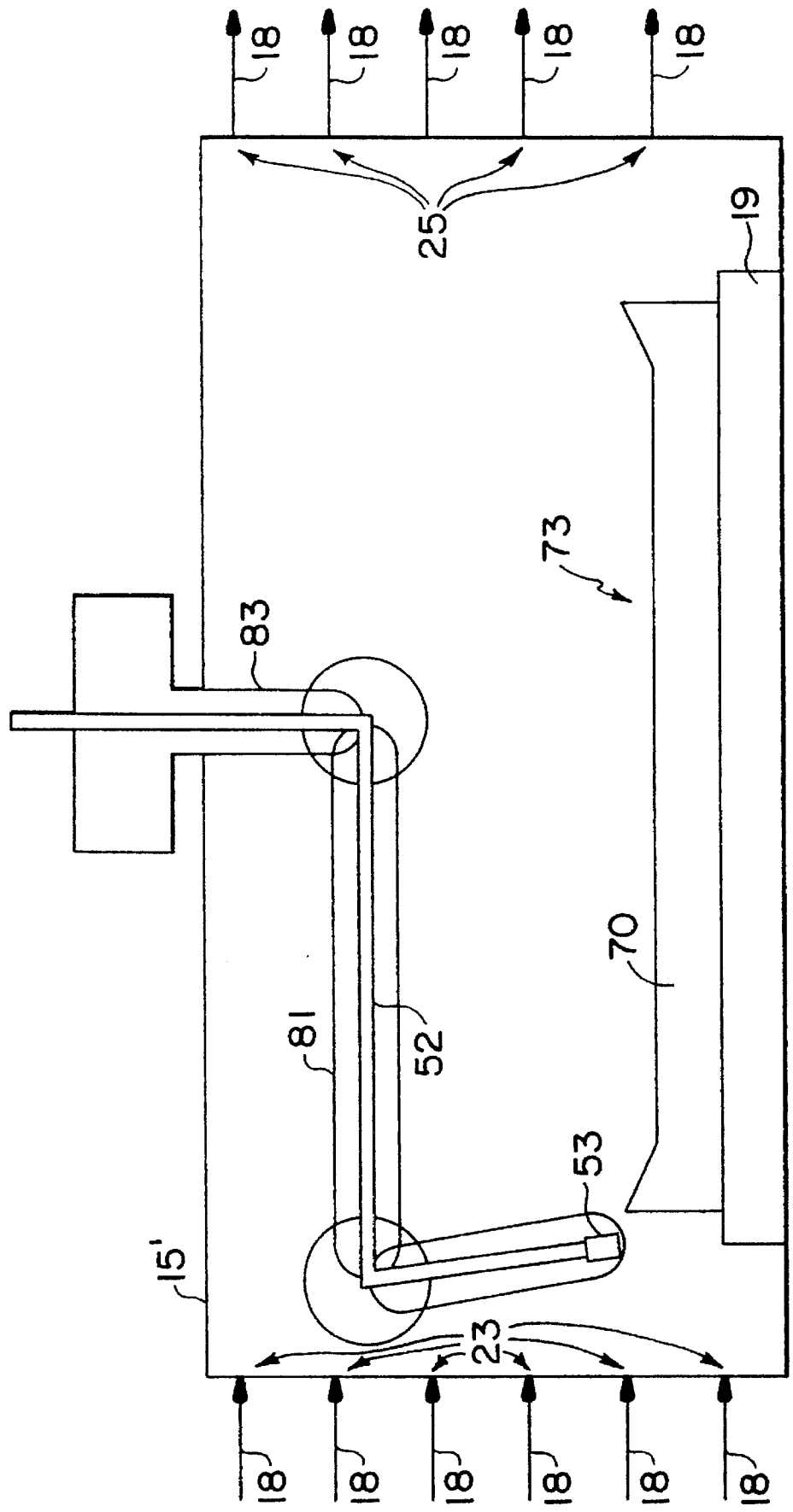

The principles in FIG. 21 apply equally to FIG. 22 wherein object 73 includes a more planar substrate treatment surface 70 such as that found on a painting.

It is anticipated that the exteriors of irregularly shaped objects may be successfully treated through the foregoing process without the use of a chamber, relying solely on gas supplied by conduit 51. Such an apparatus may be in the form of a hand-held device wherein sufficient decontamination is measured by visual inspection rather than through a gas analyzer and/or particle detector.

Figure 23:
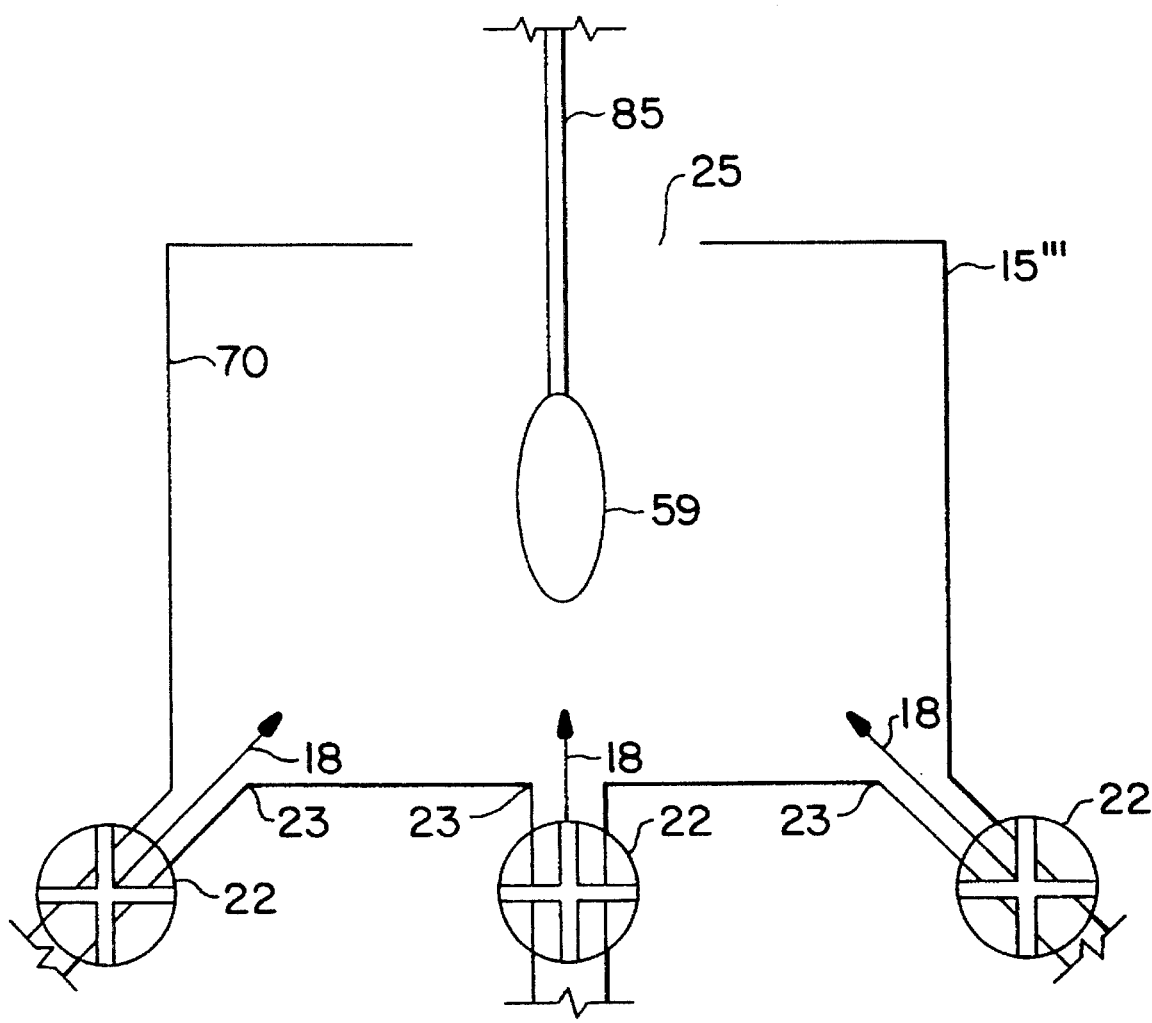
FIGS. 23 and 24 are schematic side views showing how radiation is applied in another embodiment of the invention to remove contaminant from ducted interiors.
Figure 24:
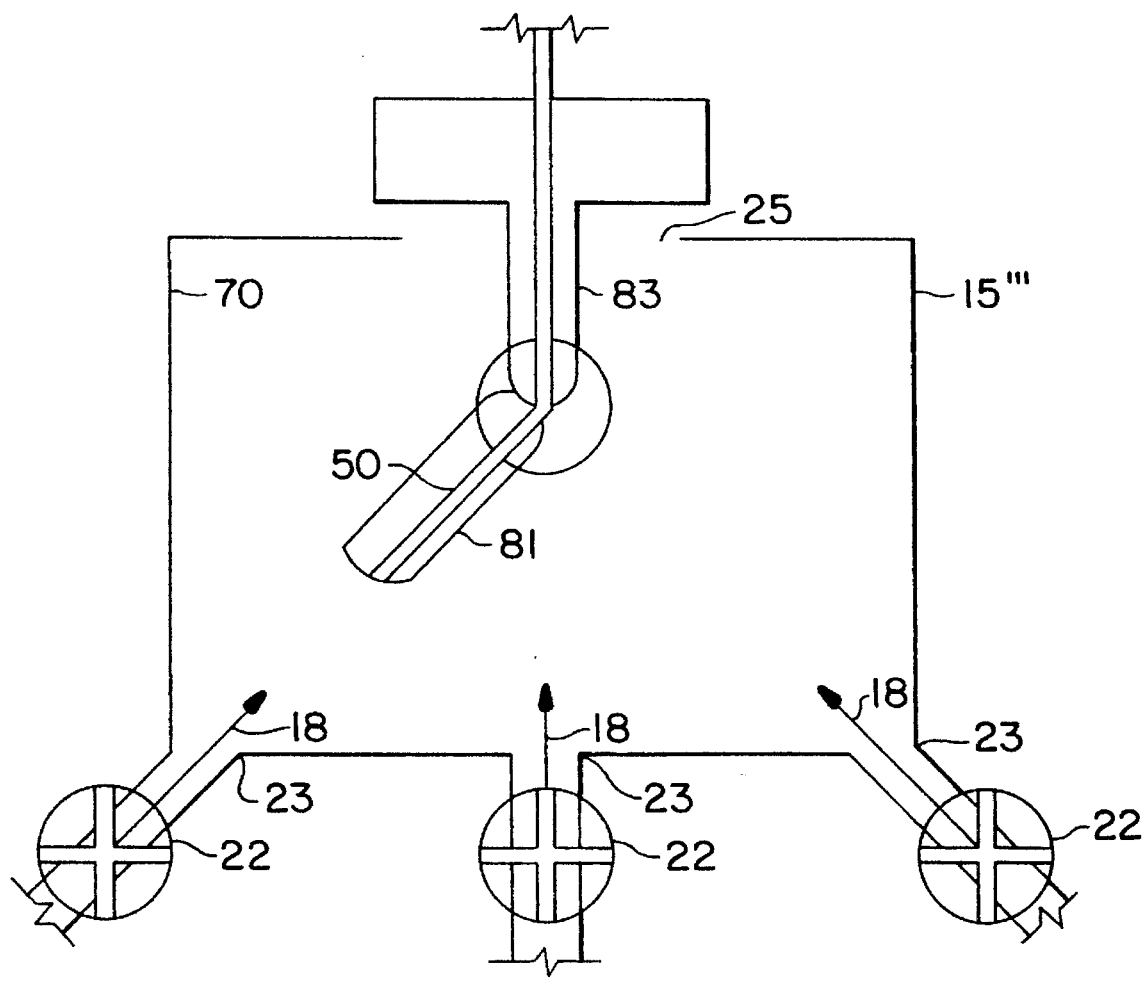

In some irregularly shaped surface applications, it may be advantageous to alter apparatus 80 by separating the gas from the radiation transmission means altogether. For example, when removing contaminants from the interior of a process chamber, one or more radiation sources, such as an ultraviolet lamp, may be placed within the chamber via support 85 as shown in FIG. 23. As the ultraviolet lamp irradiates the chamber interior 70 (substrate treatment surface), gas 18 may be provided from one or more inlets 23 to expel dislodged contaminant from the chamber 15''' via outlet 25. Gas flow 18 may be controlled by valves 22 as described above. Alternatively, radiation may be conveyed to the interior of chamber 15''' via conduit 50 and robotic arm 81 as shown in FIG. 24.

Figure 26:
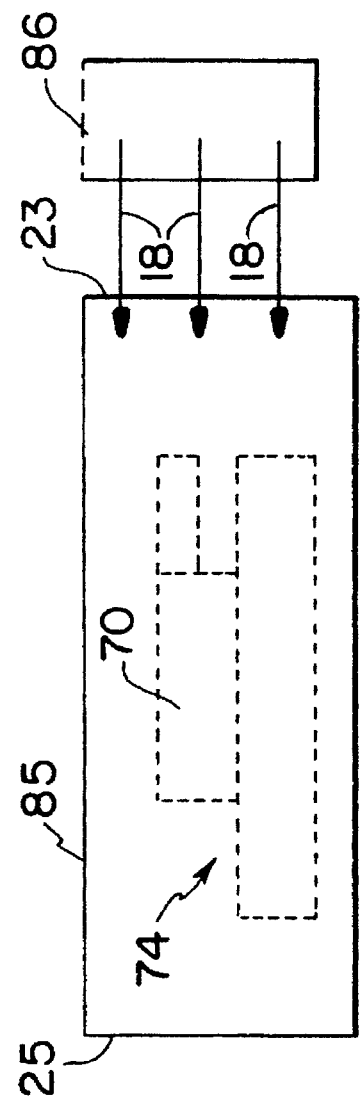
FIGS. 25 and 26 are schematic end and side views, respectively, showing how radiation is applied in another embodiment of the invention to remove contaminants from the exteriors of irregularly shaped objects.
Figure 25:
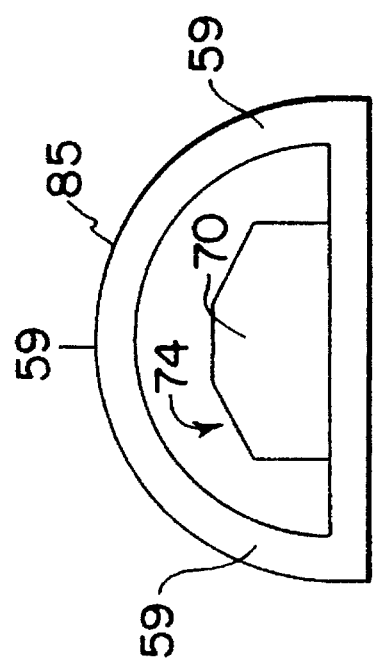

Finally, as illustrated in FIGS. 25 and 26, radiation may be generated by means of a bank of high-energy lamps 59 which essentially bathe the substrate treatment surface 70 of object 74 with a sufficient level of radiation to dislodge contaminant. Object 74, which may be an armored vehicle, is exposed to lamps 59 within "Quonset" hut 85, while inert gas 18, accelerated by fan 86, flows over the substrate surface 70. Where geometrically shielded areas may escape the gas turbulence created by fan 86 or radiation generated by bank 59, one or more apparatuses 80 (not shown) may be employed to access these areas.

What is claimed is:

1. An apparatus for removing contaminants from the surface of a substrate while preserving the molecular crystal structure of the substrate treatment surface, said apparatus comprising:
    a source of gas inert to the substrate treatment surface:
    a gas conduit for conveying a gas from said gas source, said gas conduit having a longitudinal axis and a discharge end being movable relative to the treatment surface;
    a radiation conduit for conveying radiation to the substrate treatment surface, said radiation conduit having a longitudinal axis, an inlet end, and a discharge end, said discharge end being movable relative to the substrate treatment surface;
    a source of radiation coupled to said inlet end of said radiation conduit and irradiating into said inlet end radiation having an energy density and duration sufficient to release surface contaminants from the substrate treatment surface but insufficient to alter the molecular crystal structure of the substrate treatment surface, said discharge end of said radiation conduit and said discharge end of said gas conduit being disposed so that gas discharged from said gas conduit flows across the portion of the treatment surface irradiated by radiation discharged from said radiation conduit; and
    means coupled to said gas conduit for directing the flow of gas from said discharge end of said gas conduit radially outwardly away from the longitudinal axis of said gas conduit; and
    means coupled to said radiation conduit for directing radiation from said discharge end of said radiation conduit radially outwardly away from the longitudinal axis of said radiation conduit.

2. The apparatus of claim 1 wherein said gas directing means and said radiation directing means comprises a multiple passage device mounted to the discharge end of said gas conduit and said radiation conduit.

3. The apparatus of claim 1 wherein said radiation conduit comprises a light pipe.

4. The apparatus of claim 1 wherein said radiation conduit comprises fiber optics.

5. The apparatus of claim 1 wherein said radiation source is a pulsed laser.

6. The apparatus of claim 5 wherein said pulsed laser operates in the ultraviolet range.

7. The apparatus of claim 1 wherein said radiation source is a continuous-wave laser.

8. The apparatus of claim 1 wherein said radiation source is a high-energy lamp.

9. The apparatus of claim 1 wherein said gas inert to the substrate treatment surface is a chemically inert gas.

10. The apparatus of claim 1 wherein the substrate treatment surface is disposed circumferentially about the interior of an elongated, enclosed passage and further comprising:
    a head substantially conforming in cross-sectional profile to the cross-sectional profile of the interior of the passage and adapted to longitudinally traverse the passage, said discharge ends of said gas conduit and said radiation conduit and said gas flow directing means and said radiation direction means being disposed in said head, and said head having a longitudinal axis, a first end proximal to said gas conduit and a second end distal from said gas conduit and spaced from said first end along said longitudinal axis of said head.

11. The apparatus of claim 10 wherein said gas flow directing means is configured to preferentially discharge the gas toward said first end of said head to urge removed contaminants away from said second end of said head.

12. The apparatus of claim 10 wherein said gas flow directing means is configured to preferentially discharge the gas toward said second end of said head to urge removed contaminants away from said first end of said head.

13. The apparatus of claim 10 wherein said gas flow directing means is configured to discharge gas substantially symmetrically about said longitudinal axis of said head to center said head within the passage by the flow of gas from said gas flow directing means.

14. The apparatus of claim 10 further comprising a support structure mounted to said head, substantially circumferentially surrounding said head, and being adapted to center said head within the passage.

15. The apparatus of claim 14 wherein said support structure is porous to the flow of gas and is disposed between said second end of said head and said gas flow directing means and said radiation directing means thereby avoiding contact between said support structure and portions of the treatment surfaces that have been exposed to said radiation when said head is traversed through the passage with said second end of said head leading said first end of said head.

16. The apparatus of claim 10 further comprising a cap mounted to said head adjacent to said second end of said head, said cap having a cross sectional area slightly smaller than the cross sectional area of the passage thereby inhibiting the flow of gas from said gas conduit toward said cap.

17. The apparatus of claim 10 wherein said radiation directing means comprises a plurality of radiation passages and said gas flow directing means has a plurality of gas passages.

18. The apparatus of claim 17 wherein said radiation passages and said gas passages are configured to provide a substantially uniform distribution of gas and radiation across the treatment surfaces.

\* \* \* \* \*